(12) United States Patent
Roberts et al.

(10) Patent No.: US 7,435,310 B2
(45) Date of Patent: Oct. 14, 2008

(54) METHOD FOR SURFACE IMPRINTED FILMS WITH CARBON NANOTUBES

(75) Inventors: M. Joseph Roberts, Ridgecrest, CA (US); Scott K. Johnson, Ridgecrest, CA (US); Richard A. Hollins, Ridgecrest, CA (US); Curtis E. Johnson, Ridgecrest, CA (US); Thomas J. Groshens, Ridgecrest, CA (US); David J. Irvin, Ridgecrest, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 367 days.

(21) Appl. No.: 11/452,564

(22) Filed: Jun. 7, 2006

(65) Prior Publication Data

US 2007/0152370 A1    Jul. 5, 2007

Related U.S. Application Data

(63) Continuation-in-part of application No. 10/699,442, filed on Oct. 29, 2003, now abandoned, and a continuation-in-part of application No. 10/699,440, filed on Oct. 29, 2003, now Pat. No. 7,119,028.

(51) Int. Cl.
*B29C 39/12* (2006.01)
(52) U.S. Cl. .................. 156/220; 156/219; 156/222; 156/209; 977/842; 977/773; 977/778
(58) Field of Classification Search ........... 156/219, 156/222, 209; 977/742, 842–845, 887, 773, 977/778; 136/260, 264, 263, 250; 428/357, 428/364; 264/255, 319, 129, 261, 263, 250, 264/241
See application file for complete search history.

(56) References Cited

U.S. PATENT DOCUMENTS 6,291,763 B1 *  9/2001  Nakamura ............... 136/256

(Continued)

FOREIGN PATENT DOCUMENTS

WO   WO 99/49525   *  9/1999

OTHER PUBLICATIONS

Ago et al. "Composites of Carbon Nanotubes and Conjugated Polymers for Photovoltaic Devices". Advanced Materials. vol. 11. No. 15. 1999. p. 1281-1285.*

*Primary Examiner*—Sam Chuan Yao
*Assistant Examiner*—Saeed Huda
(74) *Attorney, Agent, or Firm*—David S. Kalmbaugh

(57) ABSTRACT

A method of making films surface imprinted with nanometer-sized particles to produce micro- and/or nano-structured electron and hole collecting interfaces, include providing at least one transparent substrate, providing at least one photoabsorbing conjugated polymer, providing a sufficient amount of nanometer-sized particles to produce a charge separation interface, providing at least one transparent polymerizable layer, embedding the nanometer-sized particles in the conjugated polymer, applying the polymerizable layer and the conjugated polymer/nanometer-sized particle mixture on separate substrates where the nanometer-sized particles form a stamp surface, imprinting the stamp surface into the surface of the polymerizable film layer to produce micro- and/or nano-structured electron and hole collecting interfaces, polymerizing the polymerizable film layer to form a conformal gap, and filling the gap with at least one photoabsorbing material to promote the generation of photoexcited electrons and transport to the charge separation interface.

20 Claims, 2 Drawing Sheets

U.S. PATENT DOCUMENTS 6,517,995 B1 * 2/2003 Jacobson et al. ............ 430/320
7,119,028 B1 * 10/2006 Roberts et al. .............. 438/755
2004/0256001 A1 * 12/2004 Mitra et al. ................. 136/252

* cited by examiner ized particles including multi-
METHOD FOR SURFACE IMPRINTED FILMS WITH CARBON NANOTUBES This application is a continuation-in-part of U.S. patent application, Ser. No. 10/699,442, now abandoned, filed Oct. 29, 2003, and U.S. patent application Ser. No. 10/699,440, filed Oct. 29, 2003 now U.S. Pat. No. 7,119,028.

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefor.

BACKGROUND OF THE INVENTION

1. Field of the Invention

The present invention relates to apparatus and methods of surface imprinting films, and more specifically, films surface imprinted with nanometer-sized particles including multi-walled carbon nanotubes (MWNT) for military, commercial and recreational applications including, but not limited to, photovoltaic devices.

2. Description of the Prior Art

There is an ongoing worldwide effort within the field of nanotechnology to shrink the feature sizes of present devices thus leading to improved devices that have lower mass and volume. There is great interest in new processes for production of nanoscale features. Important new processes being developed are methods known as nano-imprinting lithography (NIL) and molecular imprinting (MI). In NIL, basically, a silicon wafer bearing a pattern produced by electron-beam lithography is used to imprint the pattern into a soft polymer film. Typically, in the molecular imprinting processes, a cross-linking polymerization of a mixture of a molecule of interest, a monomer and porogen is performed, followed by extraction of the molecule of interest, which leaves a porous polymer with imprints of the molecule of interest over its surface.

Efficient fabrication of integrated circuits requires reliable, high-throughput processing to form device elements and interconnects. The most successful patterning technique used over the past several decades has been photolithography, although developments in this technique have pushed feature resolution to the 40 nm range and have come at the expense of increasingly complex and costly fabrication equipment. To address these problems, significant effort has been placed on developing alternative methods of nanoscale patterning, including electron-beam and nanoimprint lithography. Nanoimprinting lithography (NIL), proposed in 1995, is an especially interesting approach for nanoscale pattern generation since it is in principle scalable, parallel, and cost-effective. NIL has been used most widely for creating features with a resolution of 100 nm.

In NIL, a resist relief pattern is generated via compression molding (or embossing) of a deformable polymer by a hard inorganic stamp, rather than by modifying the resist chemical structure with radiation or self-assembly. This pattern is typically transferred to the underlying substrate by anisotropic reactive ion etching (RIE), followed by material deposition and liftoff of the remaining polymer. In general, polymers used for NIL must be heated above the glass transition temperature (ca. 200° C.) to enable flow during the imprinting step. This heating process limits the application of NIL to flexible plastic substrates envisioned for a broad range of emerging applications, since many of these plastics deform at elevated temperatures. Interestingly, recent studies have reported room-temperature nanometer-scale imprinting of polymers on silicon substrates, although the procedures were not elaborated by subsequent etching and deposition. (Khang, et al., *Adv. Mater* 2001, 13, 749; and Behl, et al., *Adv. Mater* 2002, 14, 588.)

Since imprint lithography is not based on modification of resist chemical structure by radiation, its resolution is immune to many factors that limit the resolution of conventional lithography, such as wave diffraction, scattering and interference in a resist, backscattering from a substrate, and the chemistry of resist and developer.

Molecularly imprinting polymers (MIPs) are of growing interest for their potential application for advanced materials for solid-phase extraction and thin coatings for sensor devices. In most cases, the templates used for the synthesis of imprinted polymers are subnanometer molecules, including solvents, toxic components, or drugs.

Current organic solar cells include thin layers of an electrode that sandwich polymer composite sheets. When sunlight hits the sheets, they absorb photons, exciting electrons in the polymer and the molecule of interest, which makes up about 90% of the composite. The result is a useful current that is carried away by the electrodes.

U.S. Pat. No. 6,517,995 issued on Feb. 11, 2003 to Jacobson et al., that teaches an elastomeric stamp, which facilitates direct patterning of electrical, biological, chemical, and mechanical materials. A thin liquid film is patterned by embossing with a patterned elastomeric stamp. The patterned liquid is then cured to form a functional layer. This technique is limited in that it requires a elastomeric stamp and thus the degree to which the relative geometry of nanoscale components are in registry is limited by the ability to position the stamp from layer to layer.

From the foregoing, it will be appreciated that there is a need in the art to develop micro- and nano-structured electron and hole collecting interfaces for fabrication of low mass, low volume, nanofluidic devices and a variety of thin-film electronic devices. The present invention is directed to overcoming one, or more, of the problem set forth above.

SUMMARY OF THE INVENTION

The present invention relates to methods of making films surface imprinted with nanometer-sized particles to produce micro- and/or nano-structured electron and hole collecting interfaces. Embodiments of the method of making these films include: providing at least one transparent substrate, providing at least one photoabsorbing conjugated polymer, providing a sufficient amount of nanometer-sized particles to produce a charge separation interface, providing at least one transparent polymerizable layer including a sol-gel or monomer, embedding the nanometer-sized particles in the conjugated polymer, applying the polymerizable layer on a first substrate to form a charge transport film layer, applying the conjugated polymer/nanometer-sized particle mixture on a second substrate to form a nanometer-sized particles bearing surface film layer, wherein the nanometer-sized particles form a stamp surface, imprinting the stamp surface into the surface of the polymerizable film layer to produce micro- and/or nano-structured electron and hole collecting interfaces, polymerizing the polymerizable film layer to promote shrinkage to form a conformal gap between the stamp surface and the surface of the polymerizable film layer, and filling the gap with at least one photoabsorbing material to promote the generation of photoexcited electrons and transport to the charge separation interface.

The gap formed between the stamp surface and the surface of the polymerizable film layer has a uniform width throughout its entire length. Generally, the width is about 100 nanometers and can be within a range of 60 nanometers to 100 meters.

The methods of imprinting further includes compressing and thereafter, solidifying said MWNT stamp surface into the surface of the polymerizable layer. In other embodiments at least one photoabsorbing conjugated polymer include polybutylthiophene (pbT) and the nanometer-sized particles include multiwalled carbon nanotubes (MWNT).

Embodiments of the present invention depend upon knowledge of the compatible thermal properties of carbon nanotubes and sol-gel films and/or monomer films. Instead, others have sought to use highly structured interfaces in photovoltaic devices, but none have taken the approaches described in the present invention.

It is to be understood that the foregoing general description and the following detailed description are exemplary and explanatory only and are not to be viewed as being restrictive of the present invention, as claimed. These and other objects, features and advantages of the present invention will become apparent after a review of the following detailed description of the disclosed embodiments and the appended claims.

DETAILED DESCRIPTION OF THE EMBODIMENTS

Figure 1A:
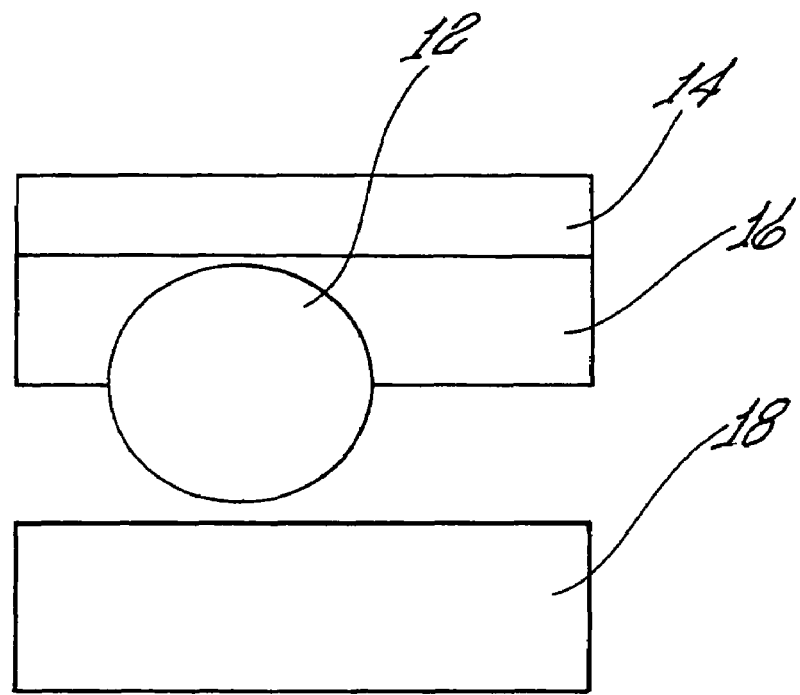
FIG. 1A is a cross sectional view illustrating the films showing the arrangement of MWNT's embedded in the conjugated polymer according to embodiments of the present invention.
Figure 1B:
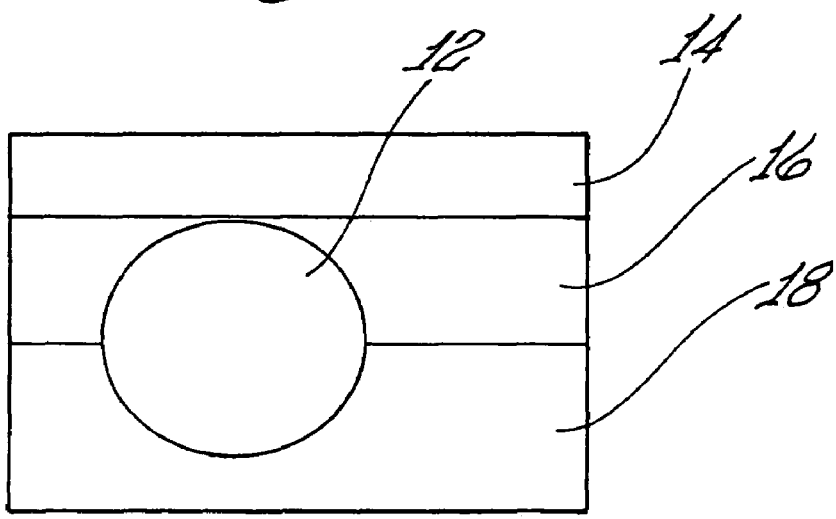
FIG. 1B is a cross sectional view illustrating the orientation of the films while during compression and imprinting according to embodiments of the present invention.
Figure 1C:
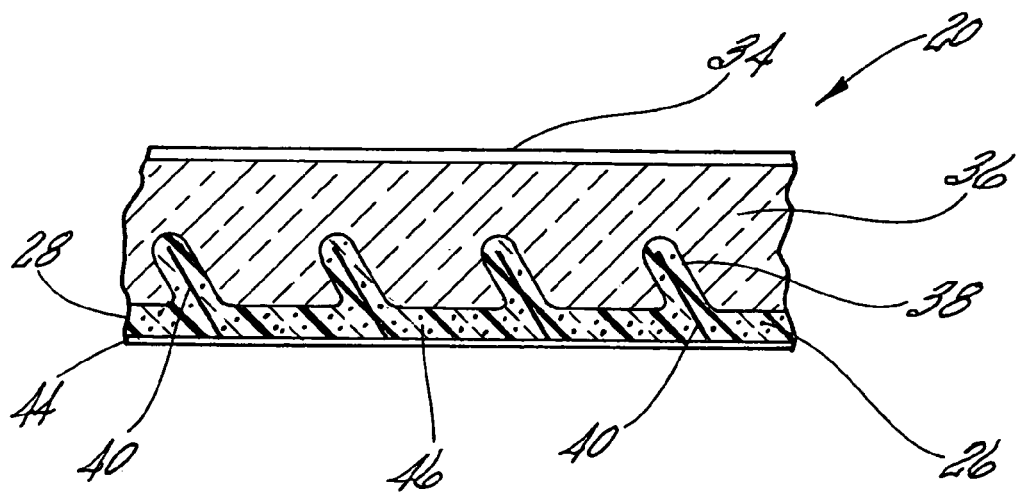
FIG. 1C is a view illustrating the polymerization of the films showing desired shrinkage of both films in the form of the stamp surface of the MWNT's according to embodiments the present invention.

The present invention relates to apparatus and methods of making films surface imprinted with nanometer-sized particles to produce micro- and/or nano-structured electron and hole collecting interfaces shown in FIGS. 1A-1C.

Embodiments of the method of making these films include: providing at least one transparent substrate 14, providing at least one photoabsorbing conjugated polymer 16, providing a sufficient amount of nanometer-sized particles 12 to produce a charge separation interface, providing at least one transparent polymerizable layer 18 including a sol-gel or monomer, embedding the nanometer-sized particles 12 in the conjugated polymer 16, applying the polymerizable layer 18 on a first substrate 14 to form a charge transport film layer, applying the conjugated polymer/nanometer-sized particle mixture on a second substrate 14 to form a nanometer-sized particles bearing surface film layer, wherein the nanometer-sized particles form a stamp surface, imprinting the stamp surface into the surface of the polymerizable film layer 18 to produce micro- and/or nano-structured electron and hole collecting interfaces, polymerizing the polymerizable film layer 18 to promote shrinkage to form a conformal gap 26 between the stamp surface and the surface of the polymerizable film layer 18, and filling the gap 26 with at least one photoabsorbing material to promote the generation of photoexcited electrons 28 and transport to the charge separation interface.

Referring now to FIG. 1C, FIG. 1C illustrates a preferred embodiment of the photovoltaic device 20. Photovoltaic device 20 includes a transparent electrode 34, which comprises a coating of at least one transparent metal oxide selected from the group consisting of $SnO_2$:F, $SnO_2$:In (ITO), and Au. Photovoltaic device 20 also has at least one transparent polymerizable layer 36 comprising a sol-gel or monomer. The Sol-gel may include absolute alcohol and ultrapure water in a ratio of about (1:0.025) and a metal oxide including titanium oxide and/or zinc oxide.

A conformal/uniform gap 26 of uniform width is formed between a multiwalled carbon nanotubes (MWNT) stamp surface 44 and the surface of a polymerizable film layer 38. A sufficient amount of nanometer-sized particles including multiwalled carbon nanotubes (MWNT) 40 are provided to produce a charge separation interface.

Conformal gap 26 is filled with a photoabsorbing conjugated polymer 46, which is a liquid, by using capillary action. The conformal gap 26 has a width of less 100 nano-meters and generally will be within a range of 60 nano-meters and 100 nano-meters. The width of conformal gap 26 remains constant throughout the length of the gap. The rational for having a gap width of less than 100 nano-meters is that the photo-excited electrons of conjugated polymers can not diffuse very far before the photo-excited electrons recombine or are trapped. The diffusion distance for photo-excited electrons before the electrons recombine or become trapped is less than 100 nanometers. At distances greater than 100 nanometers the photo-excited electrons absorb heat and do not generate electrical current. The current generation properties of a photovoltaic device 20 having a gap of uniform width which is less than 100 nanometers are substantially enhanced.

When the gap 26 is less than 60 nano-meters there is not enough photo-excited electrons within conjugated polymer 46 to absorb a sufficient amount of light to generate electrical current. When, for example, the width of gap 26 is well in excess of 100 nano-meters, the photoexcited electrons within conjugated polymer 46 are unable to bridge the distance between the carbon nanotubes 40 and the titanium oxide 36.

Other embodiments of the method of making these films include: providing at least one transparent substrate 14, providing at least one photoabsorbing conjugated polymer 16, providing a sufficient amount of nanometer-sized particles 12 to produce a charge separation interface, providing at least one transparent polymerizable layer 18 including a polymer, embedding the nanometer-sized particles 12 in the conjugated polymer 16, applying the polymerizable layer 18 on a first substrate 14 to form a charge transport film layer, applying the conjugated polymer/nanometer-sized particle mixture on a second substrate 14 to form a nanometer-sized particles bearing surface film layer, wherein the nanometer-sized particles form a stamp surface, imprinting the stamp surface into the surface of the polymerizable film layer 18 to produce micro- and/or nano-structured electron and hole collecting interfaces, polymerizing the polymerizable film layer 18 to promote shrinkage to form a conformal gap 26 between the stamp surface and the surface of the polymerizable film layer 18, and filling the gap 26 with at least one photoabsorbing material to promote the generation of photoexcited electrons 28 and transport to the charge separation interface.

The methods of imprinting further include compressing and thereafter, solidifying the MWNT stamp surface into the surface of the polymerizable layer. In other embodiments at least one photoabsorbing conjugated polymer include polybutylthiophene (pbT) and the nanometer-sized particles include multiwalled carbon nanotubes (MWNT).

A further aspect of the present invention includes films surface imprinted with nanometer-sized particles prepared by a process to produce micro- and/or nano-structured electron and hole collecting interfaces, comprising: providing at least one transparent substrate; providing at least one photoabsorbing conjugated polymer; providing a sufficient amount of nanometer-sized particles to produce a charge separation interface; providing at least one transparent polymerizable layer including a sol-gel or monomer; embedding the nanometer-sized particles in the conjugated polymer; applying the polymerizable layer on a first substrate to form a charge transport film layer; applying the conjugated polymer/nanometer-sized particle mixture on a second substrate to form a nanometer-sized particles bearing surface film layer, wherein the nanometer-sized particles form a stamp surface; imprinting the stamp surface into the surface of the polymerizable film layer to produce micro- and/or nano-structured electron and hole collecting interfaces; polymerizing the polymerizable film layer to promote shrinkage to form a conformal gap between the stamp surface and the surface of the polymerizable film layer; and filling the gap with at least one photoabsorbing material to promote the generation of photoexcited electrons and transport to the charge separation interface.

In other embodiments, the imprinting method further includes compressing and thereafter, solidifying the stamp surface into the surface of the polymerizable layer. The films of the present invention further include the method of electrophoretically depositing the nanometer-sized particles onto the polymerizable layer. These nanometer-sized particles include TiOx nanometer-sized particles. The films surface imprinted with nanometer-sized particles obtained by the process defined above.

Another aspect of the present invention includes films surface imprinted with nanometer-sized particles to produce micro- and/or nano-structured electron and hole collecting interfaces, having: at least one transparent substrate; at least one photoabsorbing conjugated polymer applied on a first substrate, wherein the conjugate polymer includes polybutylthiophene (pbT); a sufficient amount of nanometer-sized particles including multiwalled carbon nanotubes (MWNT) to produce a charge separation interface; at least one transparent polymerizable layer including a sol-gel or monomer, wherein the MWNT are embedded in the polymerizable layer and applied on a second substrate to form a MWNT bearing surface film layer to form a stamp surface; wherein the stamp surface is imprinted into the surface of the polymerizable film layer to produce micro- and/or nano-structured electron and hole collecting interfaces; polymerizing the polymerizable film layer to promote shrinkage to form a conformal gap between the MWNT stamp surface and the surface of the polymerizable film layer; and filling the gap with at least one photoabsorbing material to promote the generation of photoexcited electrons and transport to the charge separation interface.

Embodiments of the present invention having substrates include at least one of silicon, silicate, plastic, and plastic-like materials. The substrate in other embodiments acts as an electrode including a coating of at least one transparent metal oxide including $SnO_2$:F, $SnO_2$:In (ITO), and Au. In other embodiments, the substrate acts as an electrode including a coating of at least one transparent metal oxide being conducting polymers including polythiophenes, polypyrroles, polyanilines, and polybutylthiophenes.

Embodiments of the present invention include both the conjugated polymer/nanometer-sized particle mixture on a second substrate to form a nanometer-sized particles bearing surface film layer and the polymerizable layer on a first substrate to form a charge transport film layer being applied by processes comprising at least one of spin-coating, dip-coating, spray-coating, flow-coating, doctor blade coating, and screen-printing.

One skilled in the art is knowledgeable in the above processes in applying solutions to specific substrates identified in the present invention. The conjugated polymer includes pbT dissolved in chlorobenzene. The polymerizable layer includes at least one monomer film, polymer film, or a sol-gel film. The polymerizable layer having sol-gel films includes absolute alcohol and ultrapure water in a ratio of about (1:0.025) and said metal oxide includes titanium oxide and/or zinc oxide. The metal oxide includes at least one of inorganic metal salts and metal organic compounds. The metal organic compounds include metal alkoxides including at least one of titanium isopropoxide and zinc butoxide. The polymerizable layer having monomer films includes a monomer comprising at least one of oxadiazole, aniline, and pyrrole. The polymerizable layer having polymers comprising at least one of nitrogen including heterocycle(s) and/or polyanilines. When applying the polymerizable film layer on the substrate, the thickness of the layer ranges from about 1 nm to about 1 mm. When applying the conjugated polymer mixture on a separate substrate, the thickness of the layer ranges from up to about 100 nm.

The nanometer-sized particles include, but are not limited to, at least one of MWNT, singe-walled carbon nanotubes (SWNT), and nanocrystals of semiconductor materials. The nanocrystals of semiconductor materials include, but not limit to, at least one of CdSe, metal nanowires, and metal-filled carbon nanotubes. The nanometer-sized particles include average particle sizes of about 1 nm to about 100 nm in diameter and up to about 1 nm to about 1 cm in length. In other embodiments the nanometer-sized particles include average particle sizes of about 1 nm to about 100 nm in diameter and up to about 1 nm to about 500 nm in length. The photoabsorbing material includes at least one of thermotropic liquid crystalline materials, polybutylthiophene (pbT)/chlorobenzene, and polyelectrolytes.

The term "nanometer-sized particle" is defined to include objects or particles of a compound, element, or composition ranging in size from about 1 nanometer to about 100 nanometers in size. The process that produces "metal-filled carbon nanotubes" includes, but is not limited to, the following process. The introduction of metals or metal carbide and oxides into multiwalled carbon nanotubes significantly alter their conducting, electronic, and mechanical properties, arising from the internal framework within these structures. The metal-filled carbon nanotubes have a variety of industrial applications including catalysts, electronic devices, magnetic tape, and biosensors. (Bao, et al, APPLIED PHYSICS LETTERS VOLUME 81, NO. 24, 9 DEC 2002, 4592-4595.) The following examples include film fabrication processes having a first substrate bearing carbon nanotubes (CNT's) or multiwalled carbon nanotubes (MWNT's) attached or embedded into its surface which is imprinted into a metal oxide sol-gel or imprintable monomer surface followed by a polymerization process. In other embodiments, polymerization shrinkage is desirable to open a conformal gap between the CNT bearing stamp surface and the opposing sol-gel or monomer film surface. The conformal gap between the CNT bearing surface and the $TiO_2$ bearing surface was back-filled with a photoabsorbing polymer solution using capillary action. In other embodiments, thermotropic liquid crystalline materials are utilized in the back-filling procedure above due to the neat liquid crystalline heated to its isotropic phase will fill the conformal gap uniformly, and completely, in one application.

The present invention will now be explained with references to the following non-limiting examples.

EXAMPLES

Substrates were prepared and cleaned. The preparation of the Sol-gel and conjugated polymer solutions were formulated and desired micro- and nano-structured molecules were dispersed in these solutions.

Substrates chosen for this embodiment were fluorine-doped tin oxide ($SnO_2$:F) coated glass, purchased from Hartford Glass cut to size 3 inches by 1 inch. The substrates were cleaned by immersion in dilute alconox solution (detergent) at 50° C. for 1 hour, followed by rinsing with ultrapure water (17.9 Mega Ohm resistivity), isopropanol, chloroform, and absolute ethanol (absolute being 200 proof).

The sol-gel solution was prepared by mixing 9.8 mL ethanol (100%), 250 µL ultrapure $H_2O$, and 1 drop of concentrated nitric acid ($HNO_3$) in a vial. It was desirable to include an alcohol and water mix ratio of about (1:0.025). Nitric acid was utilized for acidification of the alcohol/water mix. The vial was then transferred to a glove-box purged with $N_2$ gas for approximately 1 to 2 hours for the desired preservation and storage of the mixture. Under $N_2$ in a glove-box, 1 mL of titanium isopropoxide chloride was added to make a conducting oxide (titanium oxide) mixture. The choice of conducting oxides including titanium oxide (Gelest) and zinc oxide depends upon the compatible thermal properties of CNT and the curing temperature of the sol-gel films. The solution was stirred continuously with a magnetic stirrer for at least 1 hour to promote a homogeneous mixture.

The conjugated polymer solution was formulated by dissolving 1 mg of a conjugated polymer polybutylthiophene (pbT) from Aldrich in 3 mL of chlorobenzene and filtered through a 0.4 micrometer pore size membrane filter. Approximately 1.5 mg of multiwalled carbon nanotubes (MWNT) were dispersed into the pbT/chlorobenzene mixture and sonicated for 2 hours. MWNT's utilized were produced by an in-house arc discharge process. The average particle size was approximately 12 nm in diameter and 140 nm in length.

A technique known in the art as "spin-coating" was utilized in this embodiment of the present invention to form a film layer of sol-gel or conjugated polymer on or onto the glass substrate. A spin-coating technique was utilized to apply the sol-gel solution onto the glass substrate. A few drops of titanium isopropoxide sol-gel solution was placed on the clean substrate then spun at 1000 rpm for 1 minute. After the sol-gel was spin-coated onto the substrate, the sol-gel film layer was solidified at 500° C. for 30 minutes. The spin-coating technique was used again to apply the conjugated polymer/MWNT mixture onto a separate glass substrate. While the substrate was spinning at 1000 rpm, 1 mL of the well-dispersed MWNT in pbT was pipetted dropwise at a rate of approximately 1 drop every 3 to 5 seconds. The substrate was allowed to continue spinning for an additional 1 minute at 1000 rpm. The conjugated polymer film was dried in a vacuum oven at 60° C. overnight. The amount of conjugated polymer solution spin-coated on the substrate in other embodiments of the present invention depends on the micro- and nano-structured molecule utilized in the conjugated polymer solution. In these embodiments, a sufficient amount of MWNT/pbT solution utilized permits partial to fully exposed MWNT's to protrude out from the film layer to form an impressible micro- and nano-structured surface.

After the solutions were spin-coated onto their glass substrates, the stamp surface of the conjugated polymer/MWNT film layer was imprinted into the surface of the metal oxide sol-gel film. The substrate with the sol-gel film was placed on a ceramic plate on the floor of a furnace oven at ambient or room temperature with the door open. Room temperature is defined as an indoor temperature of from about 50° F. to about 100° F. The substrate bearing the MWNT film was dropped from a height of a few millimeters onto the sol-gel film. A 35-gram weight was placed on top of the MWNT bearing substrate to prevent relative lateral movement of the substrates. The furnace oven door was then closed and the films were heated and held at 500° C. for 45 minutes. The ceramic plate carrying the substrates and weight was removed from the furnace and permitted to cool to room temperature. For characterization of the efficacy of the imprinting, some of the samples were split apart and the solidified $TiO_2$ film was imaged with a Digital Instruments DI3100 Scanning Probe Microscope. The remaining samples were left intact for photovoltaic device testing. The films of the present invention are utilized with photovoltaic devices or other light guiding devices.

Photovoltaic Device Fabrication

Figure 2:
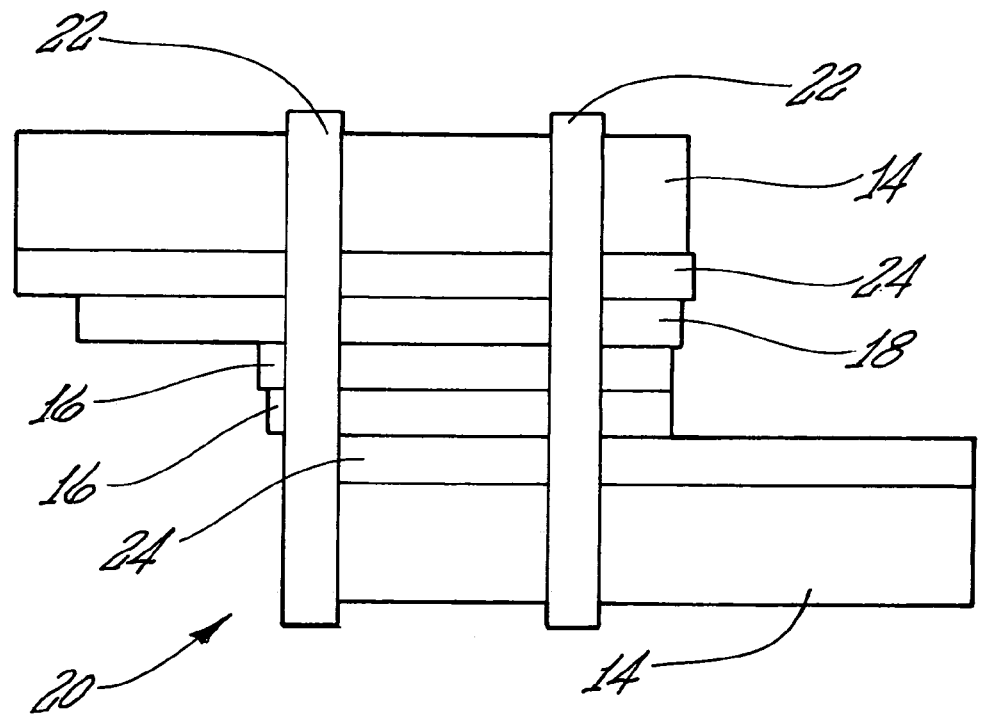
FIG. 2 is a cross sectional view of the films imprinted with MWNT's in a photovoltaic device according to the present invention.

A photovoltaic device 20 was completed by filling the space or gap 26 between the substrates 14 by capillary action with a few drops of filtered pbT in chlorobenzene solution (a desirable photo-absorbing polymer solution 16). The photovoltaic device 20 is constructed of the following components: parafilms 22, substrates 14, electrodes with $SnO_2$:F 24, sol gel/monomer 18, and conjugated polymer with MWNT 16. The photovoltaic device was dried at 60° C. in a vacuum oven overnight before testing. FIG. 2 illustrates the arrangements of the films imprinted with MWNT's in a photovoltaic device.

The photovoltaic device of the present invention was tested and the following evaluations for the photovoltaic device were performed. For all measurements the test photovoltaic device was attached to the measurement equipment using alligator clip jumpers. For voltage measurements, a calibrated Fluke 8840A multimeter (Serial # 3618080) was utilized. For amperes measurements, a Keithley Electrometer was also used. An IR blocking filter was used for all measurements (cut-on 960 nm). The resistance measured through the test photovoltaic device was 1.1 kOhms and the area of the effective device was 600 $mm^2$.

For short circuit current, Isc, and open circuit voltage, Voc, measurements, the following tests were achieved by using a 150 W Tungsten lamp at approximately 10 cm from the test photovoltaic device. Each measurement performed run a total of 60 seconds. The Tungsten lamp was turned "off" for the following intervals: 0-10, 20-30, 40-50, and 55-60 seconds. The Tungsten lamp was turned "on" for the other intervals, 10-20, 30-40, and 50-55 seconds. The test photovoltaic device was successfully illuminated with the $TiO_2$ polymerizable layer facing the light.

It should be understood that the examples and embodiments described herein are for illustrative purposes only and that various modifications or changes in light thereof will be suggested to persons skilled in the art and are to be included within the spirit and purview of this application and the scope of the appended claims.

What is claimed is:

1. A method of making films surface imprinted with nanometer-sized particles to produce micro- and/or nanostructured electron and hole collecting interfaces, comprising:
   (a) providing first and second substrates;
   (b) providing a photoabsorbing conjugated polymer;
   (c) providing a sufficient amount of said nanometer-sized particles to produce a charge separation interface;
   (d) providing a transparent polymerizable layer including a sol-gel or monomer;
   (e) embedding said nanometer-sized particles in said conjugated polymer to form a conjugated polymer nanometer-sized particle mixture;
   (f) applying said polymerizable layer on said first substrate to form a charge transport film layer;
   (g) applying said conjugated polymer nanometer-sized particle mixture on said second substrate to form a nanometer-sized particles bearing surface film layer, wherein said nanometer-sized particles form a stamp surface;
   (h) imprinting said stamp surface into the surface of said polymerizable film layer to produce nano-structured electron and hole collecting interfaces;
   (i) polymerizing said polymerizable film layer to promote shrinkage to form a conformal gap between said stamp surface and the surface of said polymerizable film layer;
   (j) filling said gap with a photoabsorbing material to promote the generation of photoexcited electrons within said conformal gap and transport of said photoexcited electrons to the charge separation interface; and
   (k) said conformal gap having a uniform width along the entire length of said conformal gap, the uniform width of said conformal gap being within a range of 60 nanometers to 100 nanometers to insure sufficient generation of electrical current resulting from an excitation of said photoexcited electrons within said photoabsorbing material.

2. The method according to claim 1, wherein the step of providing said polymerizable layer on said first substrate to form said charge transport film layer comprises at least one process selected from the group of processes consisting of spin-coating, dip-coating, spray-coating, flow-coating, doctor blade coating, and screen-printing.

3. The method according to claim 1, wherein the step of imprinting said stamp surface into the surface of said polymerizable film layer includes compressing and thereafter, solidifying said stamp surface into said surface of said polymerizable layer.

4. The method according to claim 1, wherein said nanometer-sized particles have average particle sizes of about 1 nm to about 100 nm in diameter and about 1 nm to about 500 nm in length.

5. The method according to claim 1, wherein said nanometer-sized particles comprises single-walled carbon nanotubes.

6. The method according to claim 1, wherein said nanometer-sized particles comprise nanocrystals of semiconductor materials selected from the group consisting of CdSe, metal nanowires, and metal-filled carbon nanotubes.

7. The method according to claim 1, wherein the thickness of said polymerizable film layer ranges from about 1 nm to about 1 mm.

8. The method according to claim 1, wherein said nanometer-sized particles include $TiO_2$ nanometer-sized particles.

9. The method according to claim 1, wherein said sol-gel includes absolute alcohol and ultrapure water in a ratio of about (1:0.025) and a metal oxide including titanium oxide and/or zinc oxide.

10. The method according to claim 1, wherein said first substrate acts as an electrode comprises a coating of at least one transparent metal oxide including $SnO_2$:F, and $SnO_2$:In (ITO).

11. A method of making films surface imprinted with nanometer-sized particles to produce micro- and/or nanostructured electron and hole collecting interfaces, comprising:
   (a) providing first and second transparent substrates;
   (b) providing a photoabsorbing conjugated polymer comprising polybutyl-thiophene (pbT);
   (c) providing a sufficient amount of multiwalled carbon nanotubes (MWNT) to produce a charge separation interface;
   (d) providing at least one transparent polymerizable layer including a sol-gel or monomer;
   (e) embedding said multiwalled carbon nanotubes in said conjugated polymer to form a conjugated polymer multiwalled carbon nanotube mixture;
   (f) applying said polymerizable layer on a first said substrate to form a charge transport film layer;
   (g) applying said conjugated polymer multiwalled carbon nanotube mixture mixture on a second said substrate to form a multiwalled carbon nanotubes bearing surface film layer, wherein said multiwalled carbon nanotubes form a MWNT stamp surface;
   (h) imprinting said MWNT stamp surface into the surface of said polymerizable film layer to produce nano-structured electron and hole collecting interfaces;
   (i) polymerizing said polymerizable film layer to promote shrinkage to form a conformal gap between said MWNT stamp surface and the surface of said polymerizable film layer;
   (j) filling said gap with a photoabsorbing material to promote the generation of photoexcited electrons and transport said photoexcited electrons to the charge separation interface; and
   (k) said conformal gap having a uniform width along the entire length of said conformal gap, the uniform width of said conformal gap being within a range of 60 nanometers to 100 nanometers to insure sufficient generation of electrical current resulting from an excitation of said photoexcited electrons within said photoabsorbing material.

12. The method according to claim 11, wherein the step of providing said polymerizable layer on said first substrate to form said charge transport film layer comprises at least one process selected from the group of processes consisting of spin-coating, dip-coating, spray-coating, flow-coating, doctor blade coating, and screen-printing.

13. The method according to claim 11, wherein the step of imprinting said stamp surface into the surface of said polymerizable film layer includes compressing and thereafter, solidifying said stamp surface into said surface of said polymerizable layer.

14. The method according to claim 11, wherein said first substrate acts as an electrode comprises a coating of at least one transparent metal oxide including SnO2:F, and $SnO_2$:In (ITO).

15. The method according to claim 11, wherein said photoabsorbing material is selected from the group consisting of thermotropic liquid crystalline materials, polybutylthiophene (pbT)/chlorobenzene, and polyelectrolytes.

16. The method according to claim 11, wherein said sol-gel includes absolute alcohol and ultrapure water in a ratio of about (1:0.025) and a metal oxide including titanium oxide and/or zinc oxide.

17. Method of making films surface imprinted with nanometer-sized particles to produce micro- and/or nano-structured electron and hole collecting interfaces, comprising:
(a) providing first and second transparent substrates;
(b) providing a photoabsorbing conjugated polymer;
(c) providing a sufficient amount of nanometer-sized particles to produce a charge separation interface;
(d) providing a transparent polymerizable layer including a polymer;
(e) embedding said nanometer-sized particles in said conjugated polymer;
(f) applying said polymerizable layer on a first said substrate to form a charge transport film layer;
(g) applying said conjugated polymer/nanometer-sized particle mixture on said second substrate to form a nanometer-sized particles bearing surface film layer, wherein said nanometer-sized particles form a stamp surface;
(h) imprinting said stamp surface into the surface of said polymerizable film layer to produce micro- and/or nano-structured electron and hole collecting interfaces;
(i) polymerizing said polymerizable film layer to promote shrinkage to form a conformal gap between said stamp surface and the surface of said polymerizable film layer;
(j) filling said conformal gap with a photoabsorbing material to promote the generation of photoexcited electrons and transport to the charge separation interface; and
(k) said conformal gap having a uniform width along the entire length of said conformal gap, the uniform width of said conformal gap being within a range of 60 nanometers to 100 nanometers to insure sufficient generation of electrical current resulting from an excitation of said photoexcited electrons within said photoabsorbing material.

18. The method according to claim 17, wherein said photoabsorbing conjugated polymer comprising a nitrogen containing heterocycle(s) and polyaniline.

19. The method according to claim 17, wherein said nanometer-sized particles have average particle sizes of about 1 nm to about 100 nm in diameter and about 1 nm to about 500 nm in length.

20. The method according to claim 17, wherein said nanometer-sized particles comprises single-walled carbon nanotubes.

* * * * *